(12) United States Patent
Hamidi

(10) Patent No.: US 6,370,662 B2
(45) Date of Patent: *Apr. 9, 2002

(54) MODIFYING CIRCUIT DESIGNS RUNNING FROM BOTH EDGES OF CLOCK TO RUN FROM POSITIVE EDGE

(75) Inventor: Mahyar Hamidi, San Jose, CA (US)

(73) Assignee: S3 Incorporated, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/039,973

(22) Filed: Mar. 16, 1998

(51) Int. Cl.[7] ............................................... G01R 31/28
(52) U.S. Cl. ...................................... 714/724; 714/726
(58) Field of Search ........................... 714/724, 56, 43, 714/726, 727, 734, 802, 703, 758, 763, 777, 41, 8; 364/489; 395/500.05; 716/4, 6; 326/16, 94; 327/185, 165; 710/100

(56) References Cited

U.S. PATENT DOCUMENTS

| | | | | |
|---|---|---|---|---|
| 4,703,251 A | * | 10/1987 | Baumgartner et al. | 324/617 |
| 4,825,438 A | * | 4/1989 | Bennett et al. | 714/56 |
| 5,014,226 A | * | 5/1991 | Horstmann et al. | 395/500.05 |
| 5,089,973 A | * | 2/1992 | Furtek | 364/489 |
| 5,387,885 A | * | 2/1995 | Chi | 333/100 |
| 5,533,032 A | * | 7/1996 | Johnson | 714/724 |
| 5,802,132 A | * | 9/1998 | Pathikonda et al. | 377/48 |
| 5,805,871 A | * | 9/1998 | Baxter | 713/500 |
| 5,826,067 A | * | 10/1998 | Fisch et al. | 713/503 |
| 5,960,191 A | * | 9/1999 | Sample et al. | 395/500.49 |

OTHER PUBLICATIONS

Chen, Y.P. et al. (An algorithm for zero–skew clock tree routing with buffer insertion; IEEE, Mar. 14, 1996).*
Kwang–Ting Cheng (Partial scan designs without using a separate scan clock; IEEE, May 3, 1995).*
Leijten, J et al. (Analysis and reduction of glitches in synchronous networks; IEEE: European Design and Test Conference, Mar. 6–9, 1995).*
Wei–Han Lien et al. (Wave–domino logic: theory and applications; IEEE, Feb. 1995).*
Tekumalla et al. (Delay testing with clock control: an alternative to enhanced scan; IEEE, Nov. 1–6, 1997).*
Barbagallo et al. (Scan insertion criteria for low design impact; IEEE, Apr. 28,–May 1, 1996).*
Chih–Chang Lin et al. (Scan paths through functional logic; IEEE, May 5–8, 1996).*
Chang, D et al. (Functional scan chain testing; IEEE, Feb. 23–26, 1998).*
Olsen et al. (Probabilistic clock synchronization in large distributed systems; IEEE, Sep. 1994).*

* cited by examiner

Primary Examiner—Albert Decady
Assistant Examiner—Guy Lamarre
(74) Attorney, Agent, or Firm—Christie, Parker & Hale, LLP

(57) ABSTRACT

A system and method for increasing test coverage of digital integrated circuits is provided. Clock trees are examined and circuits modified to provide for a greater number of flip-flops operating off of a positive clock edge as viewed from a clock origin.

26 Claims, 9 Drawing Sheets

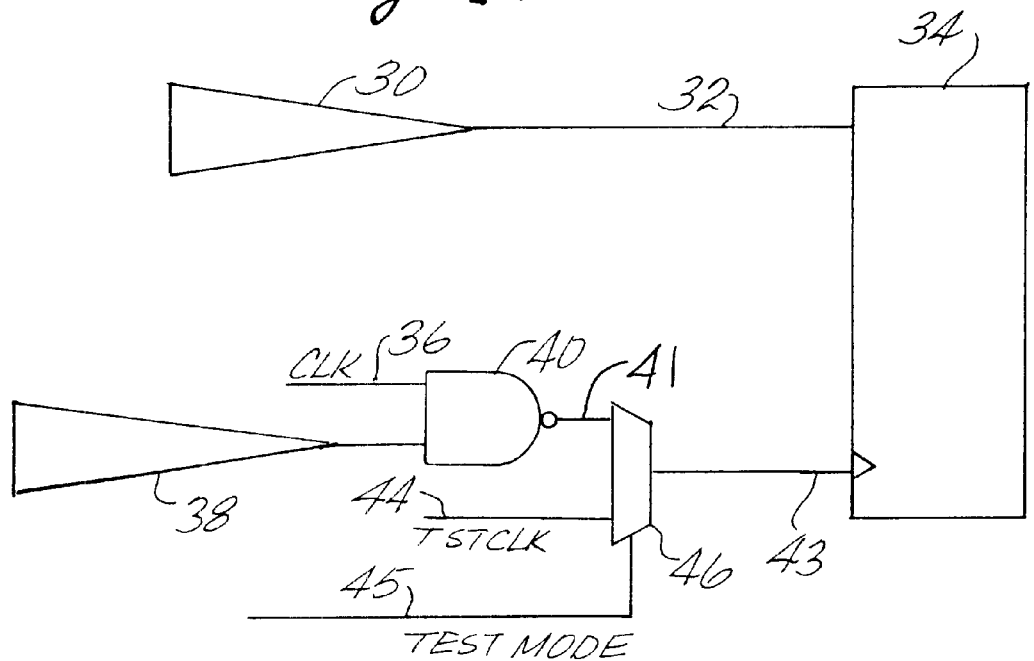
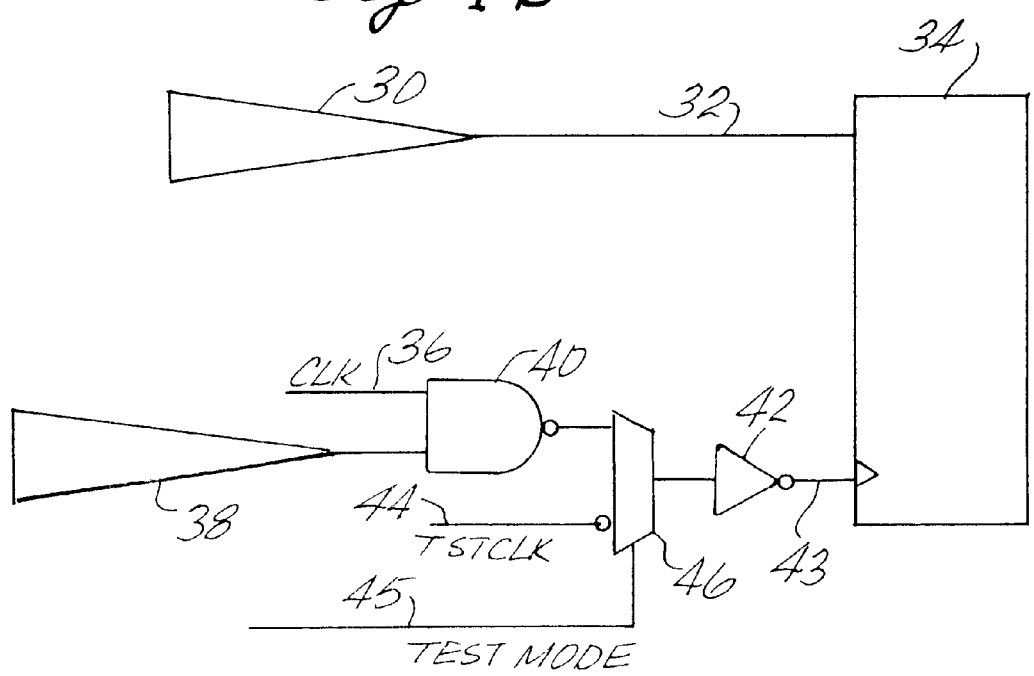

US 6,370,662 B2

MODIFYING CIRCUIT DESIGNS RUNNING FROM BOTH EDGES OF CLOCK TO RUN FROM POSITIVE EDGE

BACKGROUND OF THE INVENTION

This invention relates generally to the design of digital integrated circuits, and more specifically to automatically modifying digital integrated circuit designs to use positive clock signal transitions when changing internal circuit logic states.

The use of integrated circuits is widespread and pervasive. Integrated circuits implement complex logic operations, and often do so through the use of an exceedingly large number of logic gates. A significant concern in the design and testing of integrated circuits is that the integrated circuit, often comprising well over one million logic gates, implements specified logic operations without error.

Ideally, every possible combination of inputs to an integrated circuit is applied when the integrated circuit is in every possible internal logic state, thus allowing every possible output of the circuit to be compared with the functional requirements of the circuit. However, even for a combinational circuit, which is a circuit in which the outputs of the circuit depend directly on the inputs to the circuit, and which thereby does not contain memory elements, the number of possible input combinations is sufficiently large that the test of the circuit becomes an non-deterministic polynomial (NP) hard problem, that is one that cannot be solved in polynomial time. For a sequential circuit, which is a circuit that contains internal memory and thus may have a number of internal logic states, the problem of testing every conceivable input combination in every combination of logic states of the circuit becomes even more intractable.

Further, testing of the circuit by manipulating the primary inputs and examining the primary outputs provides little information as to a location of a fault within the circuit. The knowledge that a certain combination of inputs to a circuit results in an incorrect combination of outputs from the circuit may be of little use in determining where in the circuit the error occurs.

One method known in the art of providing additional detail as to the internal operation of the circuit is to insert scan flip-flops into the circuit. Absent other circumstances or situations, some of which are described below, any flip-flop present in a circuit may be converted to a scan flip-flop. Scan flip-flops may be used either as control points for inserting values into the circuit, or observation points for observing the operation of the circuit. Observation points are generally tied together to form a scan chain, with the scan chain forming a register which may be shifted out to capture the state of a portion of the circuit. Moreover, through the use of scan flip-flops a circuit may be divided into a number of logic cones. Each logic cone comprises a portion of the circuit, with the apex of the cone being a scan flip-flop.

An integrated circuit may contain thousands of logic cones. Accordingly, manual test of even the logic cones is impractical. Often Automatic Test Pattern Generation (ATPG) techniques are used to analyze a circuit design under test and generate test patterns providing maximum fault coverage of the circuit. The use of ATPG programs allows for extensive testing of a circuit without producing a test of such size that execution of the test is impractical.

ATPG programs are generally more efficient providing test patterns for combinational circuits than for sequential circuits. Although sequential circuits may be tested by ATPG programs, the testing requires generally substantially more time and provides substantially less coverage of the circuit under test. Moreover, ATPG programs generally require that a circuit comprising the design under test meet certain requirements so that the ATPG program may properly generate test patterns. For example, many ATPG programs require that a combinational circuit have a scan chain that operates on a single edge, usually the positive edge, of a clock signal as viewed at the origin of the clock signal. Thus, design for test tools may automatically exclude from a scan chain flip-flops using a negative edge of a clock signal as viewed at the origin of the clock signal, which may result in significant loss of test coverage.

SUMMARY OF THE INVENTION

The present invention provides a method and system for modifying digital circuits to increase the number of flip-flops or other memory elements using a single edge of a clock signal as viewed from a clock signal source. Accordingly, according to the present invention the parity of the clock signal at the clock signal source is determined. The parity of the clock signal at the clock signal source provides information as to whether a flip-flop changes state on the positive or negative edge of the clock signal as viewed at the clock signal source or origin. The circuit is modified along a clock signal path to change the parity of the clock signal at the clock signal source. This preferably changes the parity of the clock signal at the clock signal source to increase the number of flip-flops utilizing a clock signal of a first parity as opposed to a second parity during testing of the circuit.

Many of the attendant features of this invention will be more readily appreciated as this game becomes better understood by references to the following detailed description considered in connection with the accompanying drawings.

DESCRIPTION OF THE DRAWINGS

FIG. 4a illustrates the circuit fragment of FIG. 3a modified with a synthesized positive MUX insertion according to the present invention;

FIG. 4b illustrates the circuit fragment of FIG. 3b with a synthesized negative MUX insertion according to the present invention;

DETAILED DESCRIPTION OF THE INVENTION

Figure 1:
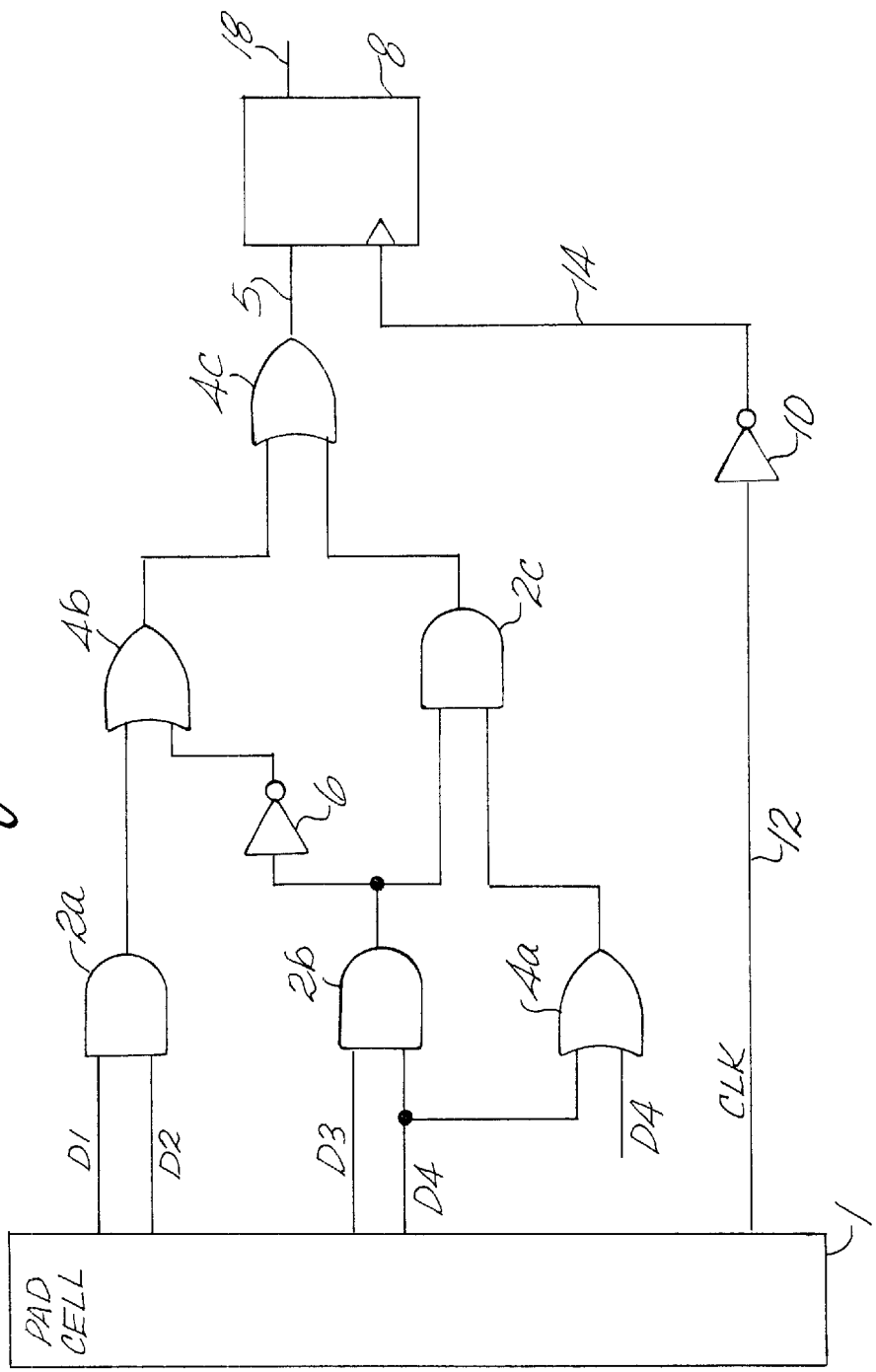
FIG. 1 illustrates a circuit fragment of a prior art integrated circuit design.

FIG. 1 illustrates a simple digital circuit. The simple digital circuit of FIG. 1 is part of a larger integrated circuit.

The circuit of FIG. 1 includes a number of AND gates 2a–c, OR gates 4a–c, two invertors 6, 10 and a flip-flop 8. The circuit has four data input signals D1–D4. The data input signals are input to the AND gates, OR gates, and the inverter 6 and result in a data output signal 5. The data output signal 5 is input to the flip-flop 8. The flip-flop 8 also has a clock input signal 14. The clock input signal 14 is formed by passing a circuit input clock signal 12 through the inverter 10. The data signals and the circuit input clock signal originate from a pad cell 1.

The pad cell is circuitry associated with the input ports of an integrated circuit. The input ports, as well as the output ports, of the integrated circuit require special capabilities in terms of signal reception and signal sourcing. Because of the required special capabilities of pad cells, among other reasons, designers of core logic functions of digital circuits and also sometimes ATPG tools often view the pad cell as the origin of signals utilized by the core logic. Thus, the circuit input clock signal 12 is viewed as the origin of the clock signal.

As illustrated, the flip-flop 8 is a positive edge flip-flop. That is, the flip-flop 8 changes state based on the rising edge of the clock. Due to the inverter 10, however, the flip-flop 8 changes state on what corresponds to the falling or negative edge of the circuit input clock signal 12 due to the inverter 10. Thus, the flip-flop 8 changes state on the negative edge of the clock signal as viewed at the clock origin. ATPG tools, however, often require that scannable flip-flops operate only on the rising or positive edge of the clock signal as viewed at the clock origin. Thus, conversion of the flip-flop 8 to a scannable flip-flop often does not result in increased test coverage using ATPG tools.

A convenient way of expressing whether a clock signal at any point in a circuit is of the same or reverse polarity as used at a flip-flop is in terms of the parity of the clock signal. At the input to a positive edge flip-flop the parity of a clock signal is 0. Accordingly, the parity of the clock signal input to the flip-flop 8 is 0. As the clock signal is traced back to its origin the parity of the clock signal changes every time the clock signal is inverted. Thus, the circuit input clock signal 12, which is the clock origin, has a parity of 1 with respect to the flip-flop 8 as the clock signal changes parity once between the flip-flop clock 8 and the clock origin.

Figure 2:
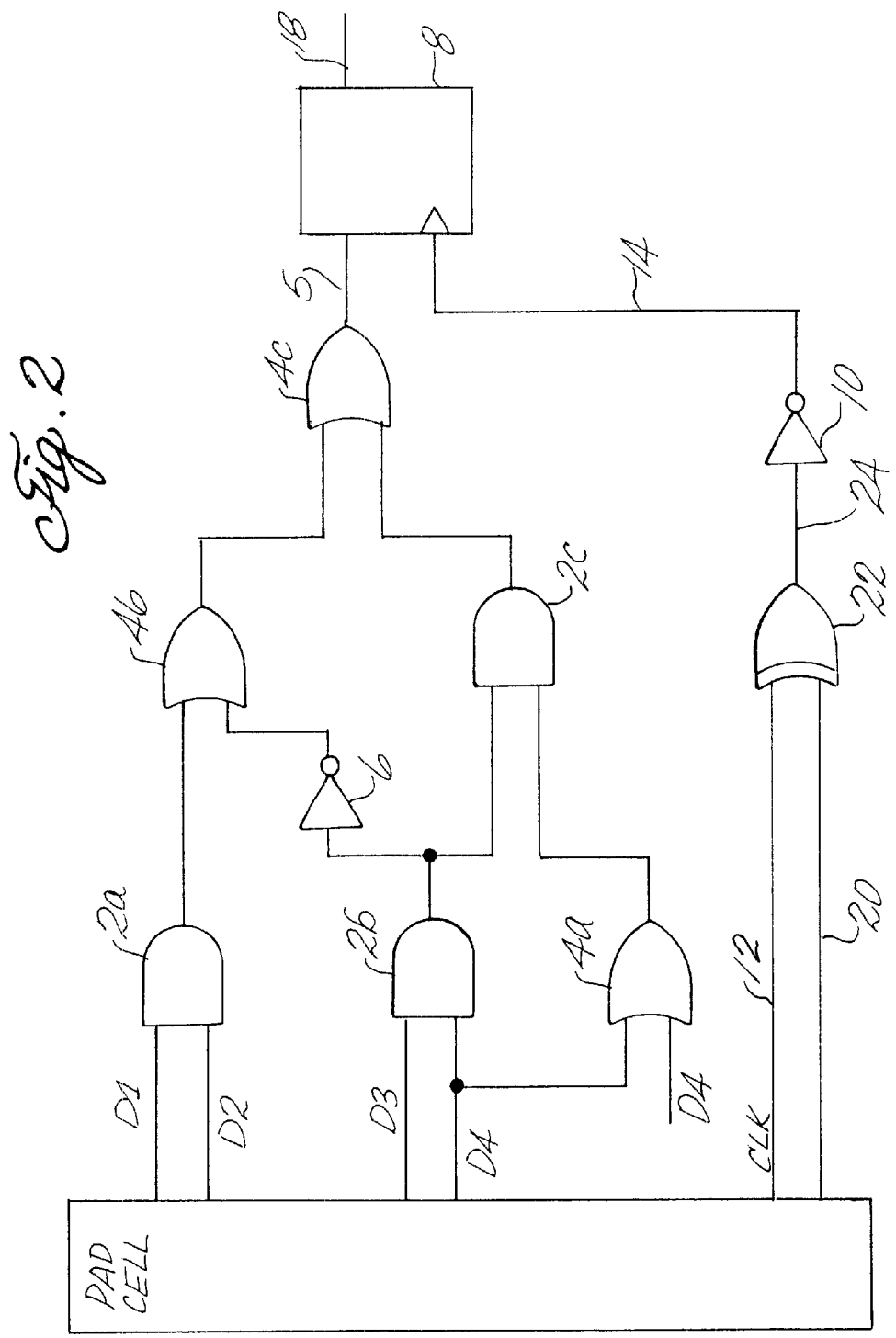
FIG. 2 illustrates the circuit fragment of FIG. 1 modified with an XOR test point according to the present invention.

FIG. 2 illustrates the circuit of FIG. 1 modified according to the present invention such that the flip-flop 8 changes state on the positive edge of the circuit input clock signal during testing. This is accomplished by inserting an exclusive OR (XOR) gate 22 into the clock path before the inverter 10. Although the use of the an XOR gate is illustrated, many other gates or combination of gates could also be utilized to provide the effect later described, and such are well known in the art. The inputs to the XOR gate are the circuit input clock signal and a test mode signal 20. The output of the XOR gate is passed to the input of the inverter 10. During normal circuit operation the test mode signal is set to 0 and the circuit input clock signal passes through the XOR gate without changing values. During testing, however, the test mode input 20 is set to 1. This in turn makes the XOR gate output 24 the inverse of the clock signal during testing. The circuit of FIG. 2 therefore provides that the flip-flop 8 operates on the positive edge of the clock signal as viewed from the clock origin when the circuit is in test mode, but otherwise operates as originally designed.

Figure 3A:
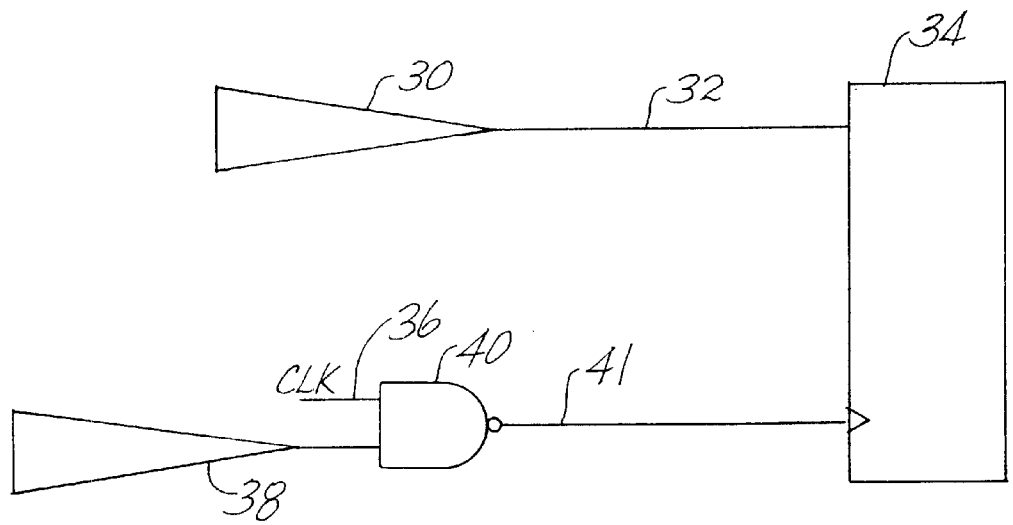
FIG. 3a illustrates a circuit fragment of a prior art integrated circuit design having a gated clock origin.

FIG. 3a illustrates another digital circuit. A number of logic gates define a cone of logic gates 30. The cone of logic gates may be the logic gates of FIG. 1, or any other set of logic gates producing a signal output in the circuit. The cone of logic gates provides a data signal 32. The data signal 32 is input to a flip-flop 34. The flip-flop 34 also has a clock input signal 41. The clock input signal 43 is formed by passing a circuit clock signal 36 and a data signal developed by a second cone of logic gates 38 through a NAND gate 40. The NAND gate prevents the flip-flop 34 from changing state depending on the results the logic operations performed in the second cone of logic gates 38. The second cone of logic gates 38 therefore serves to enable and disable the circuit clock signal 36, and such enablement and disablement may sometimes be a useful design technique. The presence of the NAND gate, however, presents difficulties to ATPG tools. ATPG tools may have difficulties in ascertaining the origin of the clock signal when a clock signal feeding a flip-flop is an output from a multiple input gate. More importantly, even if an ATPG tool can ascertain the origin of the clock signal, the ATPG tool may be unable to generate a data signal corresponding to the data signal generated by the second cone of logic gates 38 within a single clock cycle. Accordingly, the flip-flop 34 is generally excluded from testing by ATPG tools.

FIG. 4a illustrates a modification of the circuit of FIG. 3a which allows the flip-flop 34 to be included in testing. In the circuit illustrated in FIG. 4a a MUX 46 is inserted between the NAND gate 40 and the flip-flop 34. A first input to the MUX block is the NAND gate output 41. A second input to the MUX block is a test clock signal 44. The test clock signal is a clock signal provided specifically for use during testing. A control input to the MUX block is a test mode signal 45. During normal operation the NAND gate output 41 is passed by the MUX to the flip-flop 34. During testing, however, the test mode signal is set to 1, which causes the test clock signal to be passed to the flip-flop 34. This allows inclusion of the flip-flop 34 in a scan chain by ATPG tools, thereby increasing fault coverage.

Figure 3B:
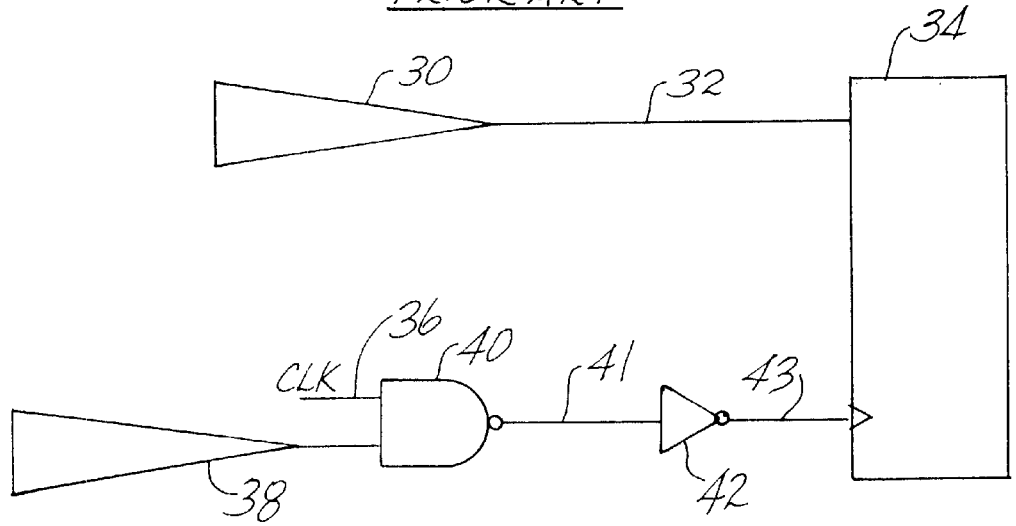
FIG. 3b illustrates the circuit fragment of FIG. 3a having an inverted clock signal.

FIG. 3b illustrates a digital circuit similar to that of FIG. 3a. In the circuit of FIG. 3b, however, an invertor 42 is placed in the clock signal path between the NAND gate and the flip-flop 34. The inverter reverses the parity of the clock signal at the output of the NAND gate, making the clock signal of parity 1. The problem presented by the gated clock origin can be resolved through insertion of a MUX as described above in the discussion pertaining to FIG. 4a. The problem presented by the clock signal of parity 1 can be resolved by additionally inserting an XOR gate, as described above in the discussion pertaining to FIG. 2. Insertion of both a MUX and an XOR gate, though, introduces additional delays in the clock signal path. A negative MUX which inverts one of its inputs, however, does not introduce as great a signal delay as does both a MUX and an XOR gate. Accordingly, the problems presented by the circuit of FIG. 3b are resolved by inserting a negative MUX 46 in the clock signal path between the NAND gate and the inverter, as shown in FIG. 4b. As illustrated, the negative MUX inverts the test clock signal 44 to achieve the desired parity.

Figure 5A:
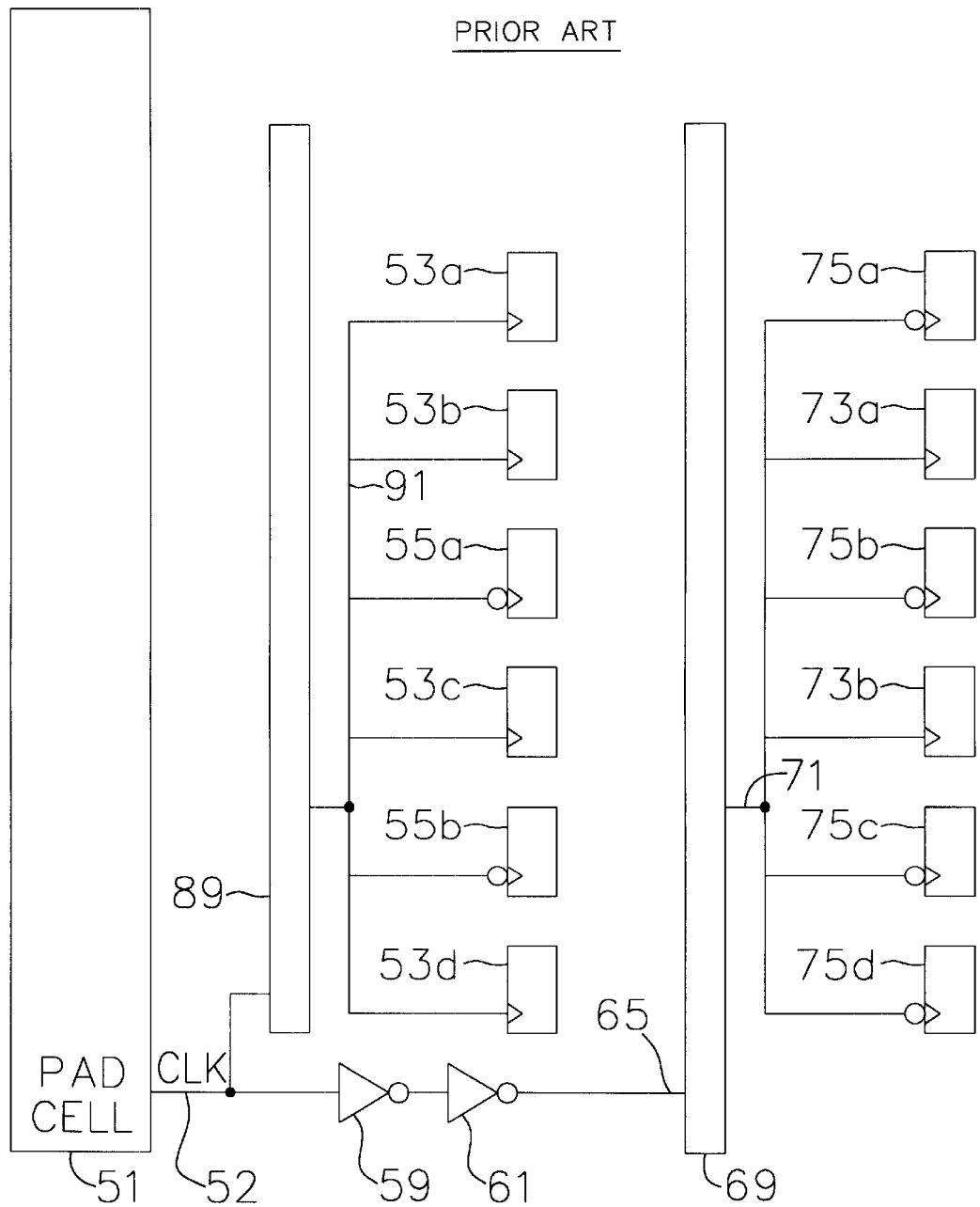
FIG. 5a illustrates a prior art circuit fragment of an integrated circuit design having a plurality of flip-flops.

FIG. 5a illustrates a circuit showing clock signal connections to a number of flip-flops. A circuit input clock signal 52 originates from a pad cell 51. The circuit input clock signal 52 is fed into a first inverter 59. The output of the first inverter 59 is passed to a second inverter 61. The circuit input clock signal 52 is also fed into a first buffer 89. Buffers are used to change signal strength characteristics, i.e., driving characteristics, and/or delay or invert the clock signal. Invertors are sometimes used to change driving characteristics of signals, and the invertors 59 and 61 are examples of a buffer. The first buffer 89 outputs a flip-flop clock input signal 91. For purposes of discussion, passing the circuit input clock signal 52 through the first buffer 89 to form the flip-flop clock input signal 91 does not result in a net inversion. In other words, the circuit input clock signal 52 and the flip-flop clock input signal 91 are of the same parity.

The flip-flop clock input signal 91 is input to a number of positive edge flip-flops 53a–d. The flip-flop clock input signal 91 is also input to a number of negative edge flip-flops 55a,b. The negative edge flip-flops are flip-flops which change state on a falling, or negative, edge of a clock signal. Unlike positive edge flip-flops, at the input to a negative edge flip-flop the parity of a clock signal is 1. Thus, the flip-flop clock input signal 91 is of parity 0 with respect to the flip-flops 53a–d and is of parity 1 with respect to the two of the flip-flops 55a,b. Because the clock signal 51 does not undergo a net inversion by the first buffer 89, the clock signal 51 is also of parity 0 with respect to four flip-flops, the flip-flops 53a–d and is of parity 1 with respect to two flip-flops, the negative edge flip-flops 55a,b.

The clock signal 52 also is input to the first inverter 59, the output of which is input to the second inverter 61. As previously mentioned, the inverters 59 and 61 may be used to delay the clock signal, to increase or decrease the strength of the clock signal, or for other purposes. The output of the second inverter 61 is fed to a second buffer 69 by way of wire 65. The second buffer 69 outputs a second flip-flop input clock signal. As with the first buffer, the second buffer does not perform a net signal inversion in forming the second flip-flop clock input signal. The second flip-flop clock input signal is provided to flip-flops 73a,b. The second flip-flop clock input signal is also provided to negative edge flip-flops 75a–d. Thus, the second flip-flop clock input signal has a parity of 0 with respect to two flip-flops, the flip-flops 73a,b, while having a parity of 1 with respect to four flip-flops, the negative edge flip-flops 75a–d. Moreover, because the clock signal is inverted an even number of times between the clock origin and the second flip-flop clock input signal, the clock signal as viewed at the origin is of parity 0 with respect to a minority of the flip-flops fed from the second buffer 69, while being of parity of 1 with respect to the majority of the flip-flops fed from the second buffer 69.

Thus, modifying the circuit of FIG. 5a at the clock origin will not result in any additional flip-flops being testable by combinational ATPG tools. Further, as a clock origin may feed a very large number of flip-flops, which may be somewhat evenly divided between positive clock edge and negative clock edge parities, modifying the circuit at the clock origin may not result in significantly increased test coverage. Determining the parity of the clock signal at the clock origin is still beneficial in that if the clock signal has a parity of 0 only no further investigation of the clock tree sourced at that clock origin is required. Additionally, many test compiler tools, including Sunrise version 2.3.b from Viewlogic Systems, Inc. (now Synopsis, Inc.), maintain data concerning the parity of clock signals at their origin, thereby providing a convenient way to determine if a clock origin is of parity 0 only. For example, executing the Sunrise program with the testrep switch set to ALL (testrep/ALL) generates a report including information regarding parity 0 clock origins and information regarding parity 1 clock origins. If a clock origin appears in the report only in the information regarding parity 0 clock origins then further investigation of the clock tree sourced at that clock origin is required.

Figure 5B:
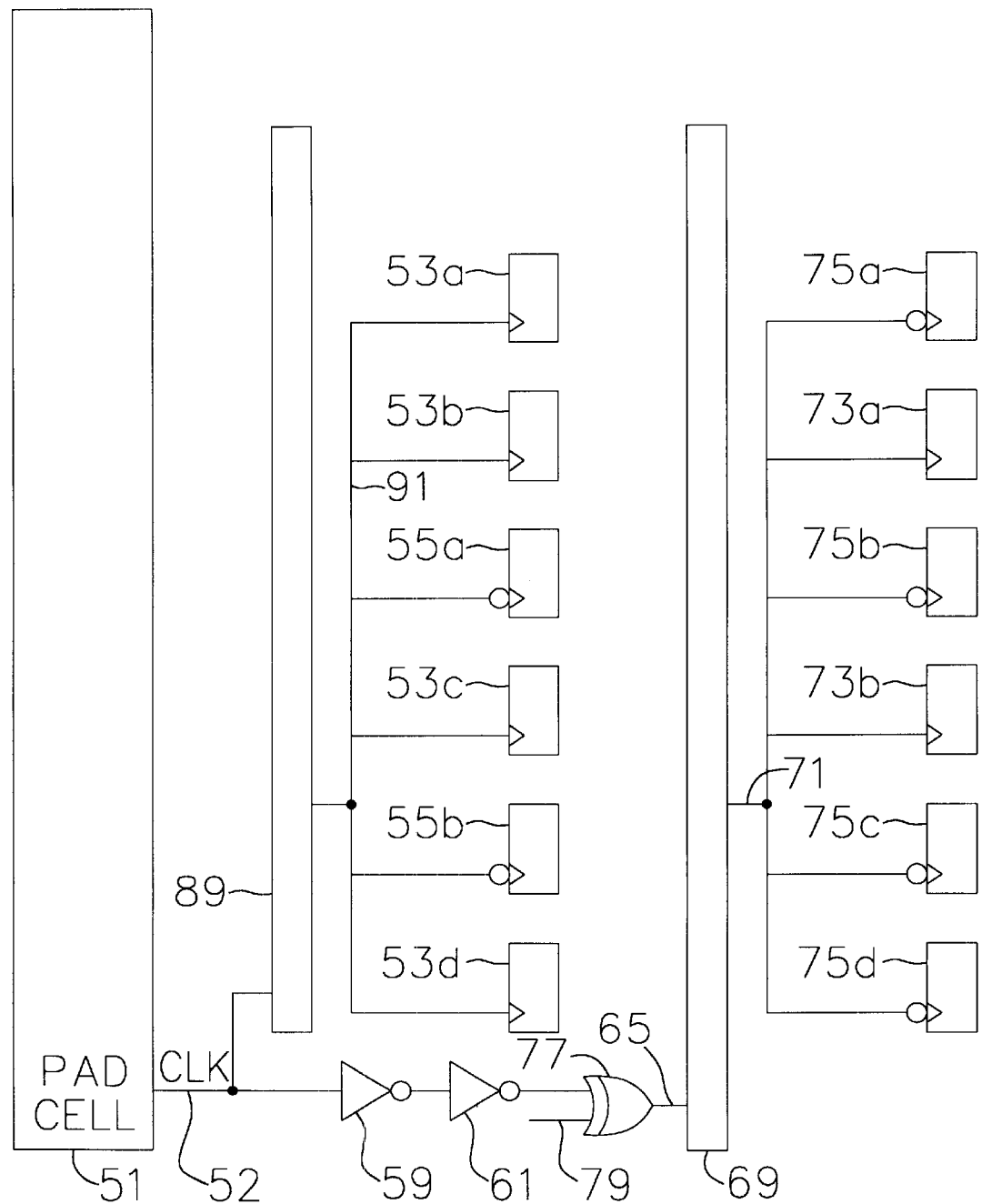
FIG. 5b illustrates the circuit fragment of FIG. 5a modified with an XOR test point according to the present invention.

The circuit of FIG. 5a may still be modified to increase the number of flip-flops available for testing, however. As illustrated in FIG. 5b, the circuit of FIG. 5a is modified by inserting an XOR gate 77 along the clock path prior to the second buffer 69. A first input of the XOR gate 77 is the output of inverter 61. A second input of the XOR gate 77 is a test mode signal 79. Inserting the XOR gate along the clock path before the second buffer is less likely to negatively affect circuit timing than does insertion of the XOR gate after the second buffer. Thus, the insertion of the XOR gate 77 increases the number of flip-flops available for testing by changing the parity of the clock signal 52 with respect to the flip-flops 73a,b and the negative edge flip-flops 75a–d, while leaving the parity of the clock signal with respect to the flip-flops 53a–d and negative edge flip-flops 55a,b unchanged.

Figure 6:
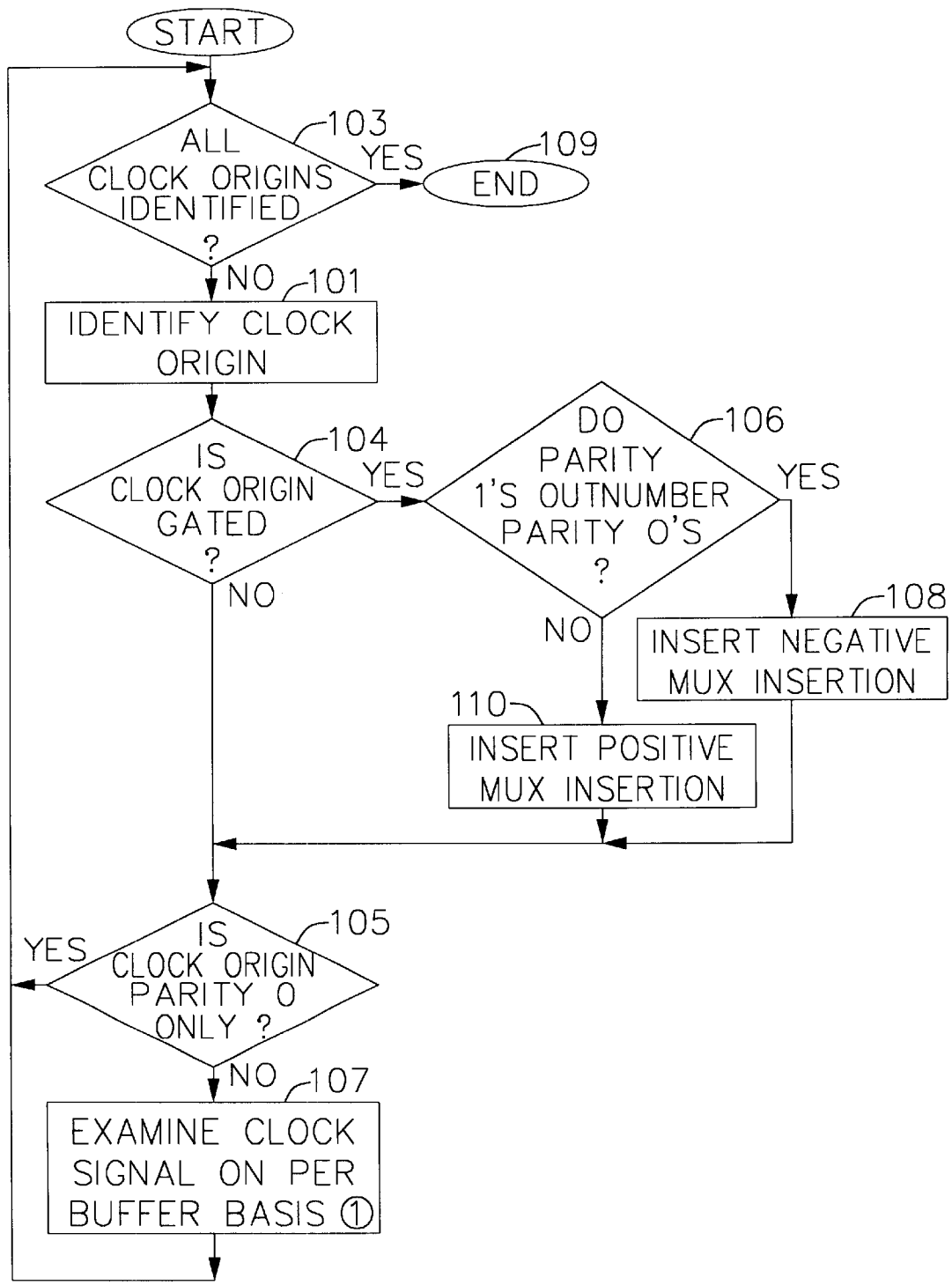
FIG. 6 illustrates a process for increasing testability of the integrated circuit by ATPG tools according to the present invention.

FIG. 6 illustrates a process for modifying a circuit to increase test coverage using a combinational ATPG tool. In a preferred embodiment this process is executed by a computer workstation such as an UltraSparc II using the Solaris operating system. Preferably the workstation is part of a computer network having file servers and the like, and workstations and networks are well known in the art.

The process of FIG. 6 identifies clock origins in the circuit in step 101. The clock origins are defined as a clock signal emanating from a pad cell or a clock signal on a wire emanating from a multi-input gate. As indicated in Step 103, the process ends after all clock origins have been identified and subsequent processing has been performed for each clock origin.

In step 104 the process determines if the clock origin is a gated clock origin. If the clock origin is a gated clock origin the process further determines in step 106 if the clock signal at the clock origin is of parity 1 with respect to a greater number of flip-flops than it is of parity 0. If this is the case then a negative MUX is inserted into the circuit at the clock origin in Step 108. If the parity 0's outnumber the parity 1's, however, then a positive MUX is inserted into the circuit at the clock origin in step 110. In one embodiment the insertion of the negative or positive MUX is accomplished by generating an instruction for the Sunrise tool to generate the insertion, with the Sunrise tool performing the actual circuit modification. In one embodiment the insertion of the negative or positive MUX is accomplished by generating an instruction for the Sunrise tool to generate the insertion, with the Sunrise tool performing the actual circuit modification. Additionally, if the circuit utilizes design methodologies which contemplate the shorting of clock signals which follow slightly different paths, preferably a positive MUX is used only.

Each clock origin is examined to determine if the clock origin is of parity 0 only in step 105. As previously mentioned, data indicating the parity of the clock signal origin may often be found in data files maintained or generated by test compiler tools such as the Sunrise tool. Data files representative of the circuit may also be directly examined to determine this information by tracing clock signals input to flip-flops back to their origin and reversing the parity on every inversion. Every time a determination is made that circuit modification is necessary, the modification may result in changing the parity of the clock signal. Accordingly, subsequent processing should take into account previous circuit modifications when determining signal parity, whether the parity of the clock signal origin is determined by examining a tool generated data file or by direct examination of the circuit. A clock origin of parity 0 only indicates that all flip-flops utilizing the clock signal change state only on the positive edge of the clock signal as viewed from the clock signal origin. If this is the case no further examination of the clock signal emanating from the particular clock origin is required, and the next clock origin is then examined. If the clock origin is not of parity 0 only then the clock signal is examined on a per-buffer basis, and the circuit is modified as appropriate, in step 107.

Figure 7:
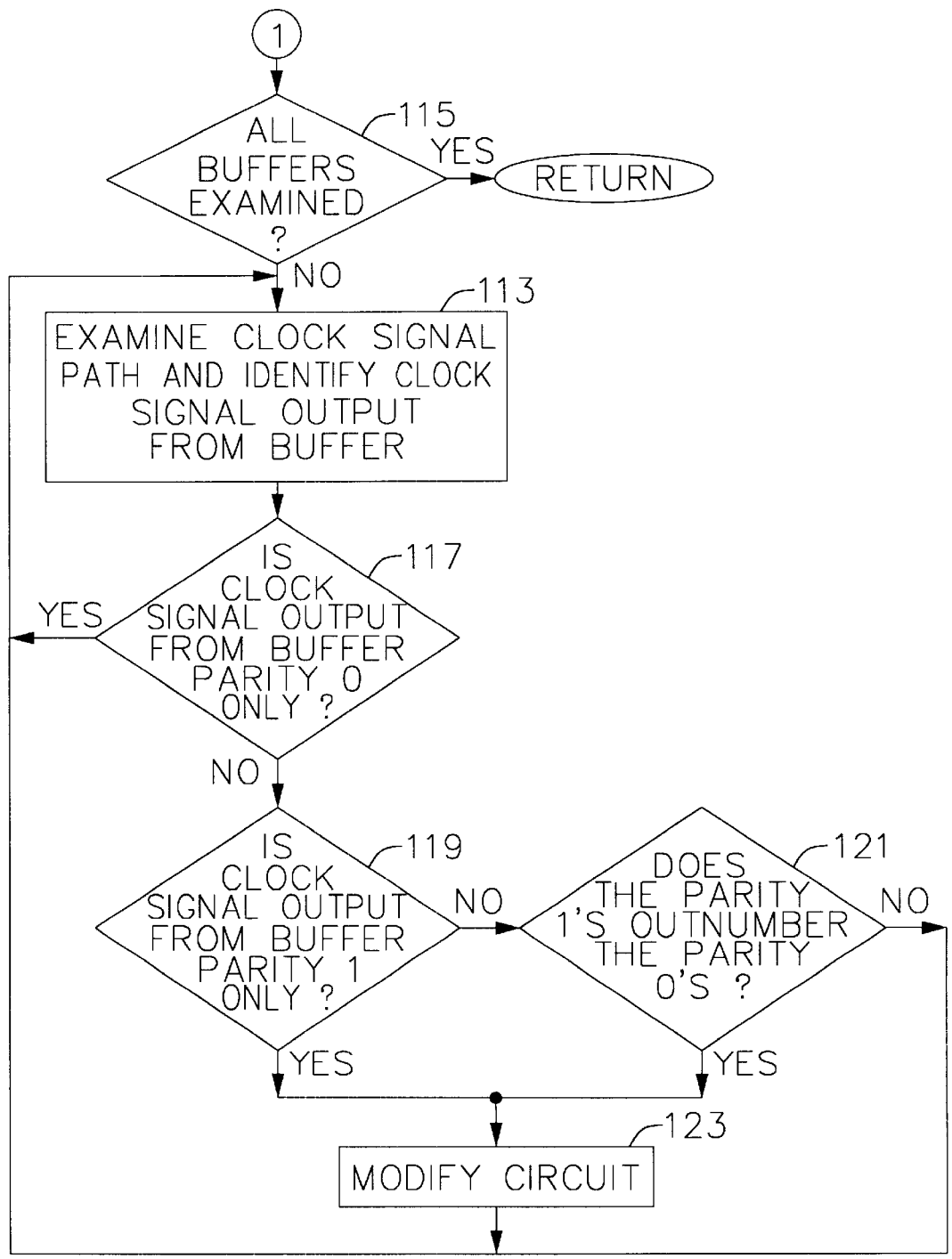
FIG. 7 illustrates a process of examining flip-flops with a clock signal emanating from a buffer of the process of FIG. 6.

FIG. 7 illustrates the process of examining clock signal buffers to determine whether further circuit modification to change clock signal parity is warranted. As indicated in step 115, the process of examining clock signal buffers continues until all such buffers have been examined. In step 113 the circuit is examined to determine if any buffers exist on the clock signal path between the clock origin and any flip-flops. If such buffers exist, the clock signal output from a buffer is identified in step 113. The process determines if the clock signal output from the buffer is parity 0 only in step 117. This determination can be made through direct examination of the circuit, or by examination of the report generated by the Sunrise tool.

Because buffers directly feed clock input signals to flip-flops, determining the parity of the clock signal emanating from the buffer resolves to determining whether a flip-flop is a positive edge flip-flop or a negative edge flip-flop. The clock signal will be of parity 0 for a positive edge flip-flop and of parity 1 for a negative edge flip-flop. If the clock signal is parity 0 only then all of the flip-flops provided a clock signal by the buffer change state only on the positive edge of the clock, as viewed from the clock origin, and the buffer being examined does not require modification. If the clock signal output from the buffer is not parity 0 only then the process determines in step 119 if the clock signal output from the buffer is parity 1 only. If the clock signal is parity 1 only then the circuit is modified in step 123. If the clock signal has elements of both parity 0 and parity 1 then the process must determine the majority parity. If the parity 1's outnumber the parity 0's, as determined in step 121, then the circuit is modified in step 123. If the parity 1's do not outnumber the parity 0's, however, then modification of the circuit would result in decreased test coverage, and therefore the circuit is not modified at the buffer being examined, and the next buffer is examined.

Figure 8:
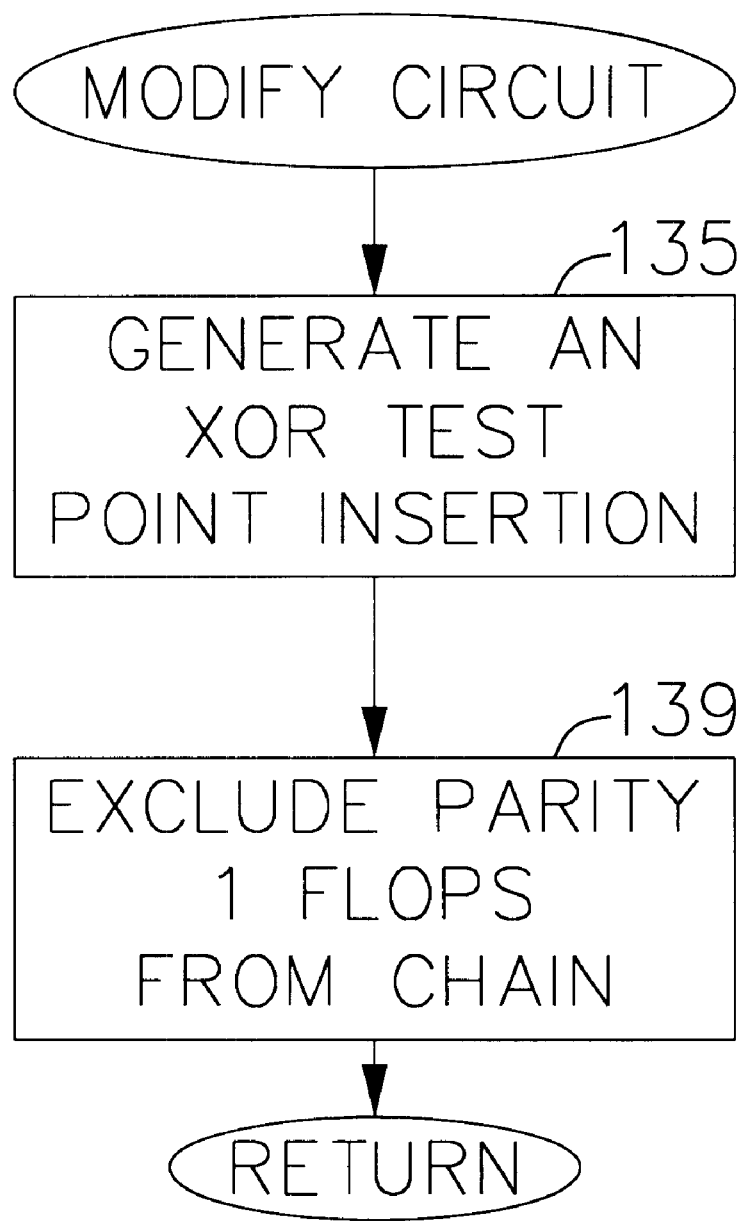
FIG. 8 illustrates a process of modifying a circuit of the process of FIG. 7.

The process of modifying the circuit is illustrated in FIG. 8. In step 135, an XOR gate is inserted along the clock's signal propagation path before the buffer feeding the flip-flops the clock signal. In one embodiment this is accomplished by generating an instruction for the Sunrise tool to generate an XOR test point insertion, with the Sunrise tool performing the actual circuit modification in step 139, parity 1 flip-flops are excluded from the scan. The process then returns.

Thus, the process described above increases the number of flip-flops available for ATPG tool testing, and thereby increases fault coverage for a design under test. Although this invention has been described in certain specific embodiments, many additional modifications and variations would be apparent to those skilled in the art. It is therefore to be understood that this invention may be practiced otherwise than is specifically described. Thus, the present embodiments of the invention should be considered in all respects as illustrative and not restricted, the scope of the invention to be indicated by the appended claims rather than the foregoing description.

What is claimed is:

1. A method of modifying a circuit containing internal memory elements which change state on a clock signal comprising:

determining a clock origin of a clock signal input to a memory element, the clock origin being an output of a gate having at least two inputs, the clock origin being linked to the memory element by a clock signal path and the clock signal having a parity at the clock origin with respect to the memory element;

determining the parity of the clock signal at the clock origin with respect to the memory element; and modifying the circuit to change the parity of the clock signal at the clock origin with respect to the memory element.

2. The method of modifying a circuit of claim 1 wherein the step of modifying the circuit modifies the circuit to change the parity of the clock signal at the clock origin with respect to the memory element only during testing of the circuit.

3. The method of modifying a circuit of claim 2 wherein the step of modifying the circuit comprises inserting a MUX block at the clock origin.

4. The method of modifying a circuit of claim 2 wherein the step of modifying the circuit comprises inserting an XOR gate in the clock signal path between the clock origin and the memory element.

5. The method of modifying a circuit of claim 4 further comprising the step of determining whether a buffer is present in the clock signal path between the clock origin and the memory element.

6. The method of modifying a circuit of claim 5 wherein the step of modifying the circuit comprises inserting an XOR gate between the clock origin and the buffer along the clock signal path.

7. The method of modifying a circuit of claim 2 wherein the clock signal is input to a plurality of memory elements.

8. The method of modifying a circuit of claim 7 further comprising determining the parity of the clock signal at the clock origin for each of the plurality of memory elements.

9. The method of modifying a circuit of claim 8 wherein the step of modifying the circuit is performed only if the parity of the clock signal at the origin is 1 for a number of memory elements greater than the number of memory elements for which the parity of the clock signal at the origin is 0.

10. The method of modifying a circuit of claim 1 wherein the step of modifying the circuit modifies the circuit to change the parity of the clock signal at the clock origin from 1 to 0 with respect to the memory element.

11. A method of modifying a circuit having a plurality of flip-flops and a clock signal source, with the flip-flops provided a clock signal originating from the clock signal source and the clock signal source having a parity, comprising:

determining the parity of the clock signal at the clock signal source for each of the flip-flops; and modifying the circuit to change the parity of the clock signal at the clock signal source during testing of the circuit if the parity for the majority of the flip-flops is a first value.

12. The method of claim 11 wherein the clock signal source is a clock origin.

13. The method of claim 12 wherein the clock origin is a pad cell.

14. The method of claim 12 wherein the clock origin is a multi-input gate.

15. The method of claim 12 wherein the clock origin is a pad cell or a multi-input gate.

16. The method of claimed wherein the clock origin is considered to be a buffer, with the buffer providing the clock signal to the flip-flops.

17. The method of claim 16 wherein the step of modifying the circuit comprises generating an XOR test point insertion at the input of the buffer.

18. The method of claim 16 wherein the step of modifying the circuit comprises synthesizing a negative MUX insertion at the clock origin.

19. A computer system for modifying a circuit having a flip-flop and a clock signal source, with the flip-flop provided a clock signal originating from the clock signal source, the clock signal source being a multi-input gate and having a parity, comprising:

means for determining the parity of the clock signal at the clock signal source; and means for modifying the circuit to change the parity of the clock signal at the clock signal source during testing of the circuit.

20. The computer system of claim 19 wherein the means for modifying the circuit modifies the circuit only if the parity of the clock signal at the clock signal source is a first value.

21. The computer system of claim 20 wherein the clock signal passes through a buffer, the buffer having an input and an output between the clock signal source and the flip-flop, with the buffer thereby providing the clock signal to the flip-flop.

22. The computer system of claim 21 wherein the buffer provides the clock signal to a plurality of flip-flops.

23. The computer system of claim 23 further comprising means for determining the number of flip-flops provided the clock signal by the buffer for which the parity of the clock signal at the output of the buffer is a first value and the number of flip-flops provided the clock signal by the buffer for which the parity of the clock signal at the output of the buffer is a second value.

24. The computer system of claim 23 wherein the means for modifying the circuit modifies the circuit only if the means for determining determines that the number of flip-flops provided the clock signal by the buffer for which the parity of the clock signal at the output of the buffer is a first parity exceeds the number of flip-flops provided the clock signal for which the parity of the clock signal at the output of the buffer is a second parity.

25. The computer system of claim 24 wherein the means for modifying the circuit modifies the circuit by generating an XOR test point insertion at the input of the buffer.

26. The computer system of claim 25 wherein the means for modifying the circuit modifies the circuit by synthesizing a negative MUX insertion at the clock origin.

* * * * *

UNITED STATES PATENT AND TRADEMARK OFFICE
CERTIFICATE OF CORRECTION

PATENT NO. : 6,370,662 B2
DATED : April 9, 2002
INVENTOR(S) : Mahyar Hamidi

It is certified that error appears in the above-identified patent and that said Letters Patent is hereby corrected as shown below:

Column 4,
Line 4, replace "43" with -- 41 --.

Column 7,
Line 45, after "modification" insert a period; and replace "in" with -- In --.
Line 46, after "scan" insert -- chain --.

Column 8,
Line 2, replace "c lock" with -- clock --.
Line 62, replace "claimed" with -- claim 12 --.

Column 10,
Line 1, replace "claim 23" with -- claim 22 --.

Signed and Sealed this

First Day of July, 2003

JAMES E. ROGAN
*Director of the United States Patent and Trademark Office*